US008868476B2

(12) United States Patent
Potkonjak

(10) Patent No.: US 8,868,476 B2
(45) Date of Patent: *Oct. 21, 2014

(54) COMBINED-MODEL DATA COMPRESSION

(71) Applicant: Empire Technology Development LLC, Wilmington, DE (US)

(72) Inventor: Miodrag Potkonjak, Los Angeles, CA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/923,250

(22) Filed: Jun. 20, 2013

(65) Prior Publication Data
US 2013/0282639 A1   Oct. 24, 2013

Related U.S. Application Data

(63) Continuation of application No. 12/996,010, filed as application No. PCT/US2010/030954 on Apr. 13, 2010, now Pat. No. 8,473,438.

(51) Int. Cl.
*G06N 5/02* (2006.01)
*H03M 7/30* (2006.01)

(52) U.S. Cl.
CPC .. *G06N 5/02* (2013.01); *H03M 7/30* (2013.01)
USPC .......................................................... 706/21

(58) Field of Classification Search
CPC .................................. G06N 5/02; H03M 7/30
USPC ....................................................... 706/21, 46
See application file for complete search history.

(56) References Cited

U.S. PATENT DOCUMENTS

| 4,202,340 | A | 5/1980 | Langer et al. |
| 5,146,228 | A | 9/1992 | Irani et al. |
| 5,506,916 | A | 4/1996 | Nishihara et al. |
| 7,643,142 | B2 | 1/2010 | van den Engh |

(Continued)

FOREIGN PATENT DOCUMENTS

WO   WO-2011/129817   10/2011

OTHER PUBLICATIONS

"Electronic Implants that Dispense Medicines Via Wireless Medical Network are on the Horizon," Feb. 6, 2009. http://www.azonano.com/news.aspx?newsID=9780, 1 page.

(Continued)

*Primary Examiner* — Jeffrey A Gaffin
*Assistant Examiner* — Dave Misir
(74) *Attorney, Agent, or Firm* — Brundidge & Stanger, P.C.

(57) ABSTRACT

Data compression technology ("the technology") is disclosed that can employ two or more prediction models contemporaneously. The technology receives data from one or more sources; shifts or re-samples one of more corresponding signals; creates a prediction model of uncompressed samples using at least two different individual or composite models; selects a subset of the models for prediction of samples; determines an order in which signals will be compressed; formulates a combined predictions model using the selected subset of models; predicts a future value for the data using the combined compression model; defines a function that has as parameters at least the predicted future values for the data and actual values; selects a compression method for the values of the function; and compresses the data using at least the predicted value of the function.

36 Claims, 9 Drawing Sheets

(56) References Cited

U.S. PATENT DOCUMENTS

| | | | |
|---|---|---|---|
| 7,653,248 | B1 | 1/2010 | Witzgall et al. |
| 8,427,346 | B2 | 4/2013 | Potkonjak |
| 2002/0103938 | A1* | 8/2002 | Brooks et al. ............... 709/247 |
| 2003/0012400 | A1* | 1/2003 | McAuliffe et al. ........... 382/100 |
| 2004/0068332 | A1 | 4/2004 | Ben-Gal et al. |
| 2005/0078017 | A1 | 4/2005 | Gergely et al. |
| 2005/0131660 | A1* | 6/2005 | Yadegar et al. ................... 703/2 |
| 2005/0244069 | A1 | 11/2005 | Wang |
| 2005/0256974 | A1 | 11/2005 | Teodosiu et al. |
| 2005/0265616 | A1* | 12/2005 | Rose ............................ 382/240 |
| 2006/0063156 | A1 | 3/2006 | Willman et al. |
| 2006/0104526 | A1 | 5/2006 | Gringeler et al. |
| 2006/0129324 | A1* | 6/2006 | Rabinoff et al. ............... 702/19 |
| 2007/0079223 | A1 | 4/2007 | Mondin et al. |
| 2007/0096954 | A1 | 5/2007 | Boldt et al. |
| 2007/0233623 | A1* | 10/2007 | Vatchkov et al. ............. 706/19 |
| 2008/0004904 | A1 | 1/2008 | Tran |
| 2008/0050025 | A1* | 2/2008 | Bashyam et al. ............. 382/238 |
| 2008/0187047 | A1 | 8/2008 | Stephan et al. |
| 2009/0069642 | A1 | 3/2009 | Gao et al. |
| 2009/0228299 | A1 | 9/2009 | Kangarloo et al. |
| 2009/0312817 | A1 | 12/2009 | Hogle et al. |
| 2010/0008424 | A1 | 1/2010 | Pace |
| 2010/0046848 | A1* | 2/2010 | Witzgall et al. ............. 382/238 |
| 2010/0076714 | A1 | 3/2010 | Discenzo |
| 2011/0251986 | A1 | 10/2011 | Potkonjak |
| 2012/0265737 | A1 | 10/2012 | Potkonjak |
| 2012/0265738 | A1 | 10/2012 | Beckmann et al. |
| 2013/0041861 | A1 | 2/2013 | Potkonjak |

OTHER PUBLICATIONS

Anderson et al, "Shakra: tracking and sharing daily activity levels with unaugmented mobile phones," Mobile Networks and Applications, v. 12 N. 2-3, p. 185-199, Mar. 2007, 15 pages.

Bai et al. "Segmentation-based multilayer diagnosis lossless medical image compression" Australian Computer Society, Inc. Darlinghurst, Australia, Australia 2004, 6 pages.

Consolvo, Sunny et al., "Design requirements for technologies that encourage physical activity," Proceedings of the SIGCHI conference on Human Factors in computing systems, Apr. 2006, 10 pages.

Danninger et al., "The connector: facilitating context-aware communication," Proceedings of the 7th Int'l conference on Multimodal Interfaces, Oct. 2005, 7 pages.

Doukas et al. "Context-Aware Medical Content Adaptation through Semantic Representation and Rules Evaluation" 3rd International Workshop on Semantic Media Adaptation and Personalization, 22 pages, 2008.

Driver, Cormac and Siobhan Clarke, "An application framework for mobile, context-aware trails," Pervasive and Mobile Computing, v. 4 N. 5, p. 719-736, Oct. 2008, 37 pages.

Gallager, R., "Variations on a Theme by Huffman," IEEE Transactions on Information Theory, vol. IT-24, No. 6, Nov. 1978, 7 pages.

Hand, E., "Head in the clouds," Nature, vol. 449, Oct. 24, 2007, p. 963, 1 page.

Harrison, Chris et al., "Lightweight material detection for placement-aware mobile computing," Proceedings of ACM symposium on User interface software and technology, Oct. 2008, 4 pages.

Hayes, Brian, "Cloud computing," Communications of the ACM, v. 51 n. 7, Jul. 2008, 3 pages.

International Search Report and Written Opinion; International Application No. PCT/US10/30950; Filed Apr. 13, 2010; Applicant: Empire Technologies Development LLC; Mailed Sep. 23, 2010; 10 pages.

International Search Report and Written Opinion; International Application No. PCT/US10/30953; Filed Apr. 13, 2010; Applicant: Empire Technologies Development LLC; Mailed Aug. 4, 2010; 11 pages.

International Search Report for PCT/US2010/030952 filed Apr. 13, 2010; Applicant: Empire Technology Development LLC, mailed Dec. 12, 2011, 2 pages.

Iso et al., "Gait analyzer based on a cell phone with a single three-axis accelerometer," Proceedings of the 8th conference on Human-computer interaction with mobile devices and services, Sep. 2006, 4 pages.

Istepanian, R.S.H. and S. Laxminaryan, "UNWIRED, the next generation of wireless and internetable telemedicine systems—editorial paper," IEEE Trans. Inform. Technol. Biomed., vol. 4, pp. 189-194, Sep. 2000, 5 pages.

Jovanov, E. et al., "Stress monitoring using a distributed wireless intelligent sensor system," IEEE Eng. Med. Biol. Mag., vol. 22, No. 3, pp. 49-55, May/Jun. 2003, 7 pages.

Kanefsky, M. & C-B Fong, "Predictive source coding techniques using maximum likelihood prediction for compression of digitized images," IEEE Transactions on Information Theory, vol. 30, Issue 5, pp. 722-727, Sep. 1984, 6 pages.

Khalil et al., "Context-aware telephony: privacy preferences and sharing patterns," Proceedings of the conference on Computer supported cooperative work, Nov. 2006, 10 pages.

Korhonen, I. et al., "Health monitoring in the home of the future," IEEE Eng. Med. Biol. Mag., vol. 22, No. 3, pp. 66-73, May/Jun. 2003, 8 pages.

Kurdi, Heba et al., "A Classification of Emerging and Traditional Grid Systems," IEEE Distributed Systems Online, v. 9 N. 3, p. 1, Mar. 2008, 13 pages.

Lederer, Scott et al., "Personal privacy through understanding and action: five pitfalls for designers," Personal and Ubiquitous Computing, v. 8 N. 6, p. 440-454, Nov. 2004, 10 pages.

Ogiela et al. "Nonlinear processing and semantic content analysis in medical imaging—a cognitive approach" Inst. of Autom.s, AGH Univ. of Sci. & Technol., Krakow, Poland, Dec. 2005, 7 pages.

Park, S. and S. Jayaraman, "Enhancing the quality of life through wearable technology," IEEE Eng. Med. Biol. Mag., vol. 22, No. 3, pp. 41-48, May/Jun. 2003, 8 pages.

Pattichis, C. S. et al., "Wireless telemedicine systems: An overview," IEEE Antennas Propagat. Mag., vol. 44, No. 2, pp. 143-153, Apr. 2002, 27 pages.

Rissanen, J., "Generalised Kraft inequality and arithmetic coding," IBM J. Res. Dev. 20, 198-203, 1976, 6 pages.

Robison, S., "A Bright Future in the Cloud," Financial Times, Mar. 4, 2008, 2 pages.

Rochwerger, B. et al., "The reservoir model and architecture for open federated cloud computing," IBM Systems Journal, vol. 53, No. 4, 2009, 11 pages.

Sahay et al. "Semantic Annotation and Inference for Medical Knowledge Discovery" NSF Symposium on Next Generation of Data Mining(NGDM), Baltimore, NSF Symposium Proceedings, 2007, 5 pages.

Shapiro, J., "Embedded Image Coding Using Zerotrees of Wavelet Coefficients," IEEE Transactions on Signal Processing, vol. 41, No. 12, Dec. 1993, 18 pages.

Siewiorek et al., "A Context-Aware Mobile Phone," Proceedings of the 7th IEEE Int'l Symposium on Wearable Computers, pp. 248-249, 2003, 10 pages.

Stanford, V., "Using pervasive computing to deliver elder care," IEEE Pervasive Computing, vol. 1, pp. 10-13, Jan./Mar. 2002, 4 pages.

Valdastri, P. et al., "An implantable telemetry platform system for in vivo monitoring of physiological parameters," IEEE Trans. Inform. Technol. Biomed., vol. 8, No. 3, pp. 271-278, Sep. 2004, 8 pages.

Witten et al. "Arithmetic coding for data compression," Communications of the ACM, v. 30 n. 6, p. 520-540, Jun. 1987, 21 pages.

Zhang et al., "An on-line universal lossy data compression algorithm via continuous codebook refinement. I. Basic results," Information Theory, IEEE Transactions on, vol. 42, pp. 803-821, 1996, 19 pages.

Ziv et al., "A Universal Algorithm for Sequential Data Compression," IEEE Transactions on Information Theory, vol. IT-23, No. 3, May 1977, 7 pages.

(56) References Cited

OTHER PUBLICATIONS

Didier Le Gall, "MPEG: A Video Compression Standard for Multimedia Applications," Communications of the ACM, v. 34 N. 4, Apr. 1991, pp. 46-58, 10 pages.

Huffman, David A., "A Method for the Construction of Minimum-Redundancy Codes," Proceedings of the I.R.E., 40, 9, September, 1098-1101, 4 pages.

International Search Report and Written Opinion for PCT/US2010/030954; Empire Technology Development, LLC; dated Aug. 25, 2010; 10 pgs.

Wallace, Gregory K., "The JPEG Still Picture Compression Standard," Digital Equipment Corporation, Maynard, Massachusetts, Dec. 1991, 17 pages.

* cited by examiner

COMBINED-MODEL DATA COMPRESSION

CROSS-REFERENCE TO RELATED APPLICATION(S)

This application is a Continuation of U.S. patent application Ser. No. 12/996,010, filed Dec. 2, 2010, now U.S. Pat. No. 8,473,438 issued Jun. 25, 2013, which is a U.S. National Stage entry of PCT Application No. PCT/US2010/030954, filed Apr. 13, 2010, each of which is herein incorporated by reference in its entirety.

BACKGROUND

Many fields of human endeavor now use computing devices. Some of these fields collect and process vast amounts of data. As an example, collected medical data can grow exponentially. A medical facility may attach several sensors to a patient, e.g., heart rate monitor, blood pressure monitor, electrocardiograph ("EKG") monitor, blood content monitor, urine analysis monitor, brain activity monitor, various other electrodes, etc. When samples are taken from these sensors at a high frequency, the data storage requirements can become immense.

In the field of telemedicine, a surgeon or physician may operate on or interact with a patient who is located at a distance, e.g., many miles away. To properly operate on or diagnose the patient, the surgeon or physician may need nearly real-time access to the remotely collected data. However, network bandwidth may be insufficient to communicate all of the collected data rapidly from the patient sensors to the physician's computing device.

Some of the collected data can require many thousands of terabytes of data storage space, if not more. It is now commonplace for even home computer users to purchase hard disk drives for personal computing devices that provide a storage capacity of 1 terabyte or more. To reduce the amount of storage space that is needed to store data, various compression methods exist.

Compression methods use a fewer number of bits to store data than the number of bits that represent the uncompressed data. Compressed data can thus require less storage space to store and reduced network bandwidth to transmit the compressed data as compared to the equivalent data prior to compression ("uncompressed data").

Compression methods can be lossy or lossless. When a lossy compression method is used to compress data, the compressed data generally cannot be used during expansion to reproduce the originally compressed data with complete fidelity. In contrast, when a lossless compression method is used to compress data, the compressed data can be used to reproduce the originally compressed data with complete fidelity.

Different compression methods are more efficient at compressing different data. Two commonly-employed compression methods are symbol-based compression method and run-length encoding ("RLE") compression method. The symbol-based compression method uses a symbol (e.g., a sequence of bits) to represent a large sequence of bits of data. For example, the symbol "1" can represent "140/90" and the symbol "2" can represent "120/80," which are two common values for blood pressure readings. When compressing a large set of medical data, "140/90" and "120/80" may occur frequently. The symbol-based compression method may substitute "1" whenever "140/90" occurs or "2" whenever "120/80" occurs.

In contrast, the RLE compression method may be more efficient for compressing data when the data includes long sequences of identical values. As an example, when a set of data that is to be compressed includes the values "11111111122222," which may be a sequence of periodic readings from a sensor, the RLE compression method may substitute this set of data with "9152" because there are nine "1"s and then five "2"s in the data. However, the RLE compression method may be less efficient than a symbol-based compression method when the data values fluctuate rapidly.

Even among various symbol-based compression methods, the selection of symbols can affect compression performance. In the example of symbol-based compression provided above for blood pressure readings, the data would not be compressed well if a patient's blood pressure readings rarely contained the values "140/90" or "120/80" and there were no symbols defined for other values.

SUMMARY

Figure 1:
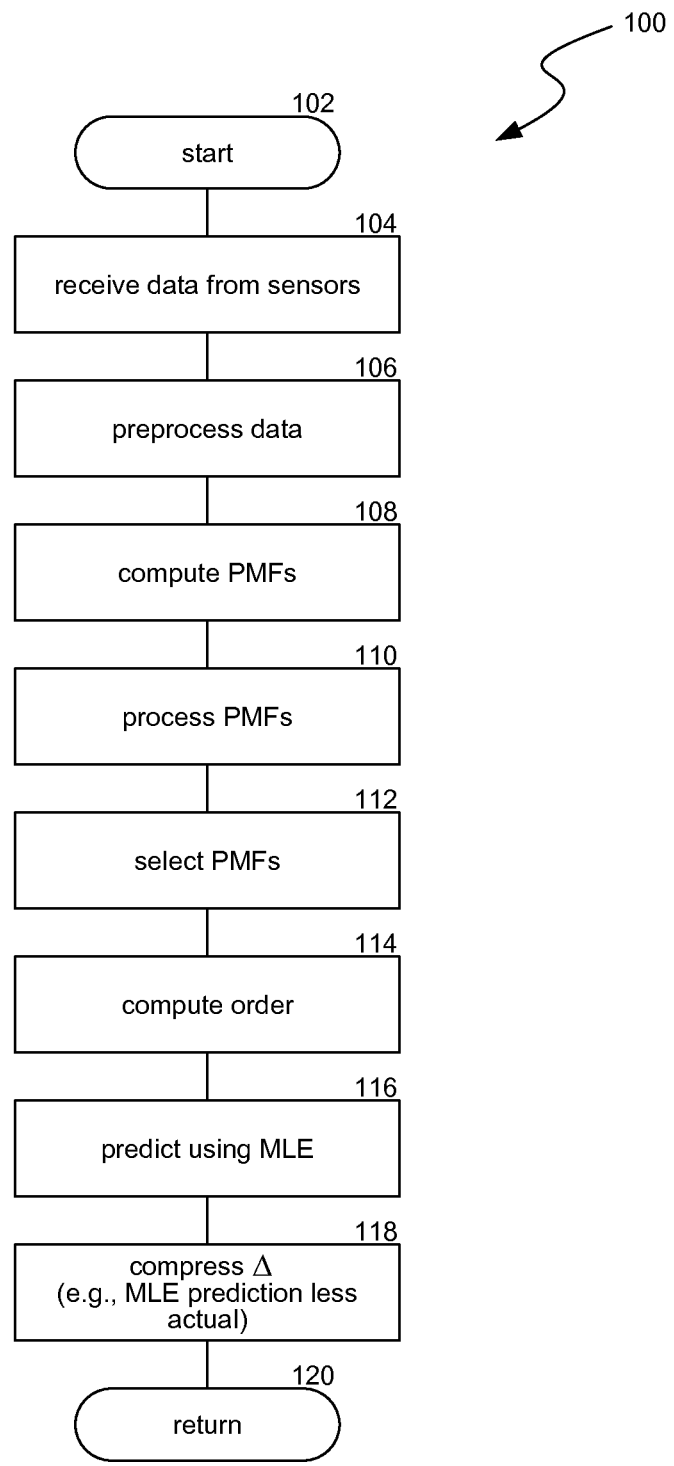
FIG. 1 is a flow diagram illustrating a routine invoked by data compression technology for compressing data in some embodiments.

Data compression technology ("the technology") is disclosed that can employ two or more prediction models contemporaneously. The technology receives data from one or more sources; shifts or re-sample one or more corresponding signals; creates a prediction model of uncompressed samples using at least two different individual or composite models; selects a subset of the models for prediction of samples; determines an order in which signals will be compressed; formulates a combined predictions model using the selected subset of models; predicts a future value for the data using the combined compression model; defines a function that has as parameters at least the predicted future values for the data and actual values; selects a compression method for the values of the function; and compresses the data using at least the predicted value of the function.

DETAILED DESCRIPTION

Data compression technology ("the technology") is disclosed that can employ two or more prediction models contemporaneously. In various embodiments, the technology receives data from one or more sources (e.g., corresponding to a sensor signal); creates at least two different prediction models for the original, time-shifted or correlated signals, combines the prediction models into a composite model that is used for actual prediction of signal samples, and creates a functions (e.g., difference or delta) of the actual prediction and actual signal that is compressed. In some embodiments, the technology employs a probability mass function ("PMF") for prediction from symbols that are identified for use during a previous compression; predicts a future value for the data using a maximum likelihood estimation technique that combines two or more models; and compresses the data using at least the predicted future value.

To achieve a high rate compression, the technology predicts the compressed signal very accurately from already compressed signals. The technology predicts the signal of interest much better from two or more predictors when the signals and/or predictors are not strongly correlated.

There are at least six potential sets of predictors: (i) previous samples of the same sensor signal; (ii) temporally late samples of the same signal when latency is tolerated; (iii) current samples from other correlated sensors signals; (iv) previous samples from other correlated sensors signals; (v) temporally late samples of other sensors signals when latency is tolerated; and (vi) any already created predictor. The technology predicts a signal at specific time much more accurately using several statistically processed sources of predictions from the same or different sources.

The technology selects predictors that have low entropy; selects an amount by which each signal should be time-shifted by conducting a search (e.g., binary or linear); selects signals for combined predictions that have low levels of correlation; creates combined predictors using MLE or non-parametric statistical techniques, and minimum expected error prediction techniques; compresses prediction signals by creating a new signal using the actual signal and the predicted signal (e.g., the function could be their difference or delta); and iteratively applies the technique by using iterative searching. As an example, the technology may create k techniques for the first level, and then another k at each level and keep the total of the m best multilevel results.

Figure 8:
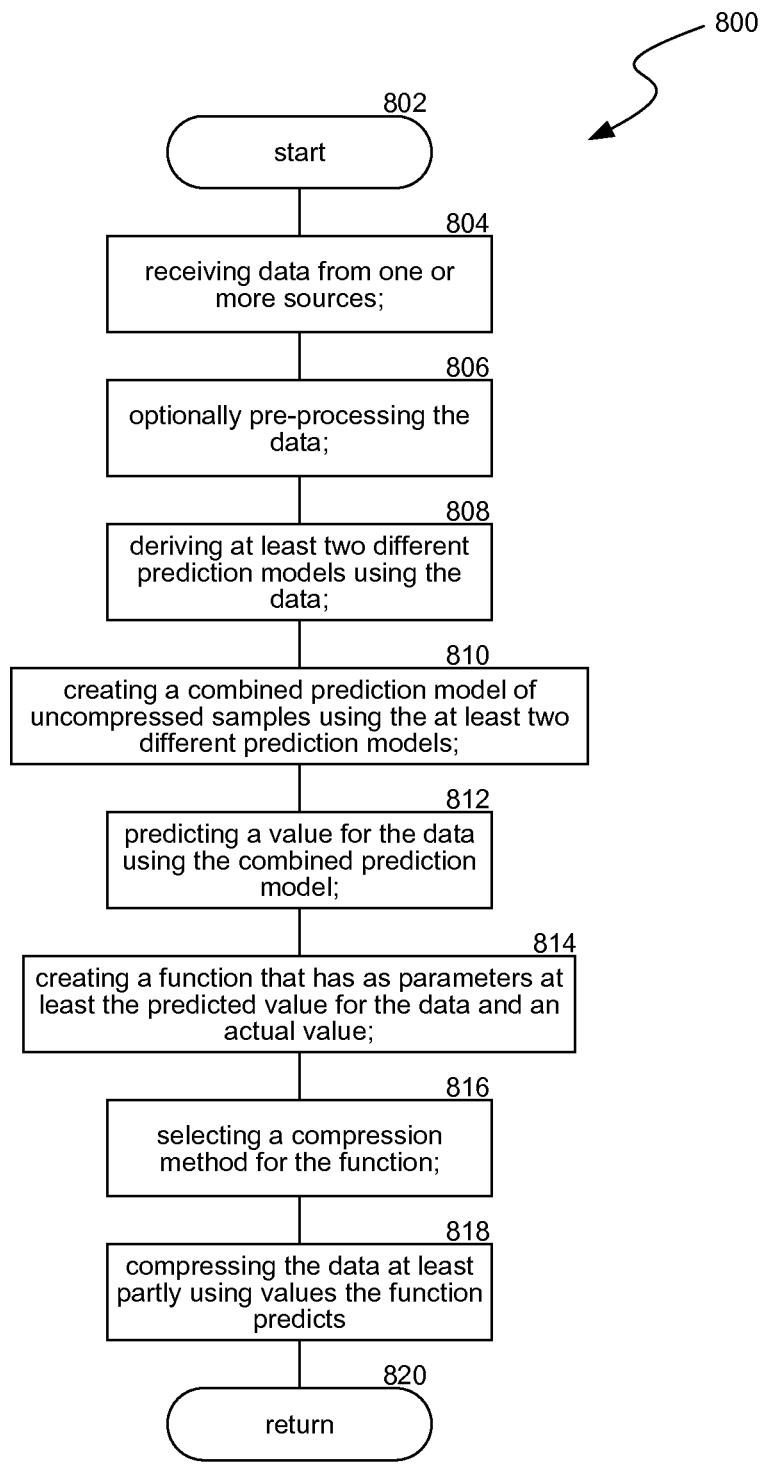
FIG. 8 is a flow diagram illustrating a routine implemented by the technology in some embodiments.

In various embodiments, the technology implements a method (see FIG. 8) 800 for compressing data, comprising: receiving data from one or more sources 804; optionally pre-processing the data 806; deriving at least two different prediction models using the data 808; creating a combined prediction model of uncompressed samples using the at least two different prediction models 810; predicting a value for the data using the combined prediction model 812; creating a function that has as parameters at least the predicted value for the data and an actual value 814; selecting a compression method for the function 816; and compressing the data at least partly using values the function predicts 818. The method can include pre-processing the received data to increase its suitability for compression or prediction of other samples from the same or correlated sources using resampling, requantization, time shifting, transformations, smoothing or other signal processing and/or statistical techniques. The method can include measuring an effectiveness of pre-processing using an entropy of a corresponding probability mass function (PMF). The deriving can include creating parametric or non-parametric statistical processing of a probability mass function (PMF) for each pair of predicting and predicted signals. The prediction function may be created using a maximum likelihood expectation (MLE) procedure. Creating the function can include finding a difference between the predicted and the actual signal. The selecting can include using statistical properties of the created function and each available compression technique. The receiving, optionally pre-processing, deriving, creating the combined prediction model, and predicting can be performed in at least two different ways to create two functions.

In various embodiments, the technology implements a method for compressing data, comprising: receiving data from one or more sources; shifting or re-sampling one of more corresponding signals; creating a prediction model of uncompressed samples using at least two different individual or composite models; selecting a subset of the models for prediction of samples; determining an order in which signals will be compressed; formulating a combined predictions model using the selected subset of models; predicting a future value for the data using the combined compression model; defining a function that has as parameters at least the predicted future values for the data and actual values; selecting a compression method for the values of the function; and compressing the data using at least the predicted value of the function. The method can include pre-processing the received data to increase their suitability for compression or prediction of other samples from the same or correlated sources using resampling, requantization, smoothing or other signal processing or statistical techniques. The method can include relative time shifting of one or more signals so that they predict each other more accurately. The probability mass function (PMF) and joint PMFs can be used for analyzing suitability of the signal for compression and for prediction of the same or other correlated signals respectively. Parametric and non-parametric statistical models can be used for analyzing the suitability of signals. The statistical model can be one or more of classification and regression trees (CART), multivariate adaptive regression splines (MARS), or neural networks. The method can include processing a PMF and joint PMFs using smoothing, regression, or other parametric or non-parametric statistical techniques. A set of PMFs or joint PMFs or other indicators of suitability for compression can be selected in such a way that for each signal there is at least one path from a signal where each signal that is in the path can be compressed. The compression of samples of each signal can be placed in order in such a way that signals that have a high function of low entropy as indicated by its PMF and low joint PMF entropies for the predicted signals are processed first. The method can include attempting several different orderings and selecting the most effective ordering. Data values can be determined synchronously from two or more signal streams. Data values can be determined in a staggered manner from two or more signal streams.

The technology may include a system, comprising: a component configured to receive data from one or more sources; a component configured to shift or re-sample one of more corresponding signals; a component configured to create a prediction model of uncompressed samples using at least two different individual or composite models; a component configured to select a subset of the models for prediction of samples; a component configured to determine an order in which signals will be compressed; a component configured to formulate a combined predictions model using the selected subset of models; a component configured to predict a future value for the data using the combined compression model; a component configured to define a function that has as parameters at least the predicted future values for the data and actual values; a component configured to select a compression method for the values of the function; and a component configured to compress the data using at least the predicted value of the function.

Various sensors are often used to collect data, e.g., medical data from patients. The signals from these sensors can be either collected digitally or converted to digital numeric form, e.g., by using an analog-to-digital converter. The collected data can then be stored, such as by a computing device. Semantic awareness of the data can be beneficial in improving the analysis and/or compression of this data. Three observations are provided herein, but various embodiments of the disclosed technology may be capable of operating whether or not one or more of these observations hold true for any particular patient. (I) Data can have a level of similarity that makes it possible to treat different values as equivalent values. As an example, it may be beneficial to know that two values (e.g., 120 and 121 for the systolic portion of a blood pressure reading) are so similar that no meaningful difference exists between the two. Thus, a common symbol can be used during compression to represent both 120 and 121. (II) The collected data may also have a high correlation between the sensed values. As an example, as the temperature of a patient or the ambient temperature changes, the systolic portion of a blood pressure reading of the patient may also change in a predictable manner. When multiple sensors are applied to a patient, values collected from the sensors may thus be correlated, e.g., based on the patent's medical condition. The data (and/or predicted data) from any two sensors may be asymmetric, and so deciding the relative order in which sensed signals are mutually predicted and compressed as well as how much to relatively shift each signal can greatly improve compression ratios or preservation of important features of the initial signals. (III) Because the sensed data are the result of physical, chemical, and biological phenomena, they may not occur randomly. As an example, it is rare for a patient's blood pressure or temperature to jump randomly. Indeed, it is more likely for there to be gradual changes. Such signals may be more easily capable of prediction (and therefore optimized compression) if the phenomena are at least partially understood and characterized. As an example, consider sensors deployed in an athletic device, such as a shoe. There are three natural phases for an athlete when walking, running, or jumping: taking off, landing, and airborne. When taking off and landing, the pressure on sensors decrease or increase, respectively. In such cases, delta compression techniques may perform well. When airborne, the pressure is zero on all sensors and therefore run-length encoding or other compression technique that records only non-zero (or zero) samples may be superior.

In various embodiments, the technology builds a combined data compression model that it builds using a combination of multiple data compression models. The technology can then predict future data based on received data. By predicting the future data, the technology is capable of compressing the data because the future data can be expressed using the built model. Sensors emit signals that may be converted to digital form using an analog-to-digital converter ("A/D converter"). The A/D converter may "oversample" the signal by registering and storing many samples within a specified time period—sometimes more than is required to accurately represent the signal. When signals are oversampled, they can be highly autocorrelated or mutually correlated. The technology is capable of preprocessing the data to determine whether prediction of future signals is possible. In various embodiments, the technology may apply a maximum likelihood expectation principle to predict the signal. The technology may iteratively predict the value that the A/D converter emits for any given signal from a sensor. To losslessly compress a signal, the technology may compress a difference between a predicted value and an actual value emitted by the A/D converter. As an example, the technology may employ conventional compression methods to compress the nominal difference. In various embodiments, the technology computes probability mass functions ("PMFs") for symbols that can be used to compress the data, and then can optimize the PMFs (e.g., by using smoothing techniques). The technology may then apply maximum likelihood estimation ("MLE") techniques known in the art to predict and compress the signals, e.g., by combining the PMFs into a combined-model.

In various embodiments, the technology first compresses signals that are good predictors of other signals. Doing so facilitates compression of other signals. In various embodiments, the technology can be applied for either lossless or lossy compression, and for both single and multiple signal streams from one or more sensors.

In various embodiments, sensors may transform one or more physical attributes (e.g., medical patient-related attributes) into data. Examples of attributes can include heart rate, blood pressure, blood analysis, urine analysis, stools analysis, etc.

The technology will now be described with reference to the Figures ("drawings"). In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a flow diagram illustrating a routine 100 invoked by data compression technology for compressing data in some embodiments. The routine begins at block 102. At block 104, the routine receives data from sensors. As an example, the routine may receive data that has been converted by an A/D converter upon receiving signals from one or more sensors.

At block 106, the routine preprocesses the received data. In various embodiments, during MLE prediction-based compression as a postprocessing step, the technology may use differential encoding, linear transformation, or any other transformations that decreases the entropy of individual or multiple "chained" PMFs or increase time lagged autocorrelation or cross-correlation function.

At block 108, the routine computes PMFs. In some embodiments, the routine can preprocess the data to smooth it, reduce entropy, etc., using various techniques known in the art. As examples, the routine may apply differential encoding, transformations (e.g., linear transformations), based on autocorrelation or cross-correlation of the data.

At block 108 the routine computes probability mass functions ("PMFs"). A PMF is a function that gives the probability that a discrete random variable is equal to a specified value. A PMF differs from a probability density function ("PDF") in that the values of a PDF, which are defined for continuous random variables, are not probabilities as such. Instead, the integral of a PDF over a range of possible values gives the probability of the random variable falling within that range. In various embodiments, the routine can create or update individual and joint PMFs using parametric or non-parametric statistical techniques. The routine may apply smoothing or regression techniques when creating PMFs. As an example, the routine may employ a user-specified smoothing function that receives entropy and other constraints.

At block 110, the routine processes the computed PMFs. The routine may process the PMFs to make them suitable for optimization by applying one or more smoothing functions. As examples, the routine may apply kernel smoothing, monotonic and/or unimodular regressions, etc.

At block 112, the routine selects one or more PMFs. The routine may select PMFs that optimize the compression rate. As an example, the routine may characterize each processed PMF using one or more properties, e.g., entropy, smoothness, number of jumps in values, monotonicity, unimodularity, etc. The routine may then determine how well the selected PMFs perform during compression.

In some embodiments, the routine employs cross-correlations for selecting optimal individual and joint PMFs. As an example, the routine may identify groups of PMFs that predict a large number of signals well, but have low levels of correlations.

In some embodiments, the routine may select individual and joint PMFs for MLE-based compression that employ variance and covariance. As an example, the routine may identify groups of PMFs that predict a large number of signals well, but have low levels of variance and covariance.

In some embodiments, the routine may employ integer linear programming to select a small number of PMFs that accurately predict all signals. In some embodiments, the routine may employ lagged PMFs to make MLE predictions.

In some embodiments, the routine may select a small set of PMFs that employ a frequency of updating that is proportional to the likelihood that each PMF is actually used during compression. As an example, the routine may set a frequency to infinity for a majority of PMFs in the set and then update only a specified number of PMFs.

In some embodiments, the routine may increase or decrease the frequency of PMF updating by computing the accuracy of predictions. As an example, as the accuracy of prediction increases, the frequency of updating can be reduced and vice versa. The frequency may be reduced linearly and increased multiplicatively to enable fast adjustments. In some embodiments, the routine may employ both forward and backward prediction when constraints of latency allow such policies.

In some embodiments, the routine may map predictors into a graph domain and solve it using integer linear programming, heuristics, and/or other combinatorial techniques. As an example, the routine may map the MLE-prediction problem to an instance of independent k-level dominating set wherein the goal is to select a set of minimal cardinality so that each node is dominated by at least k other nodes. The mapping can be accomplished as follows: each PMF in the MLE-based prediction can be mapped onto a node; and a directed edge from a node A to a node B is added if the prediction of node B from node A is above a threshold level of accuracy.

At block 114, the routine computes orders for the PMFs. As an example, the routine can compute an order in which the selected PMFs are to be applied (e.g., combined). At block 116, the routine predicts future values of signal data using an MLE technique. The data can be compressed according to the computed order of PMFs. The routine may use synchronous, staggered, or aperiodic ordering.

In some embodiments, the routine applies synchronous ordering of compression of the correlated variables by compressing variables that are good predictors of other yet-to-be-compressed variables (e.g., signal stream data). The ordering of the variables can be done in such a way that predictions using PMFs of autocorrelation and cross-correlations are maximally exploited for accurate MLE computation whereby only a small percentage of low correlated PMFs are used to build an overall MLE model. As an example, the model can be a product of probabilities that a particular value is observed at a particular signal if other correlated signals have a set of similar or equal values. As an example, the routine may employ integer linear programming ("ILP") to find optimal ordering. As an alternate example, the routine may employ maximally constrained minimally constraining heuristics in which it schedules compression streams for compression that have their relevant streams (e.g., for joint use) already scheduled for compression.

In some embodiments, the routine staggers ordering of compression of the correlated variables wherein each sample of each stream is recorded at a separate time. The ordering of the variables is done in such a way that predictions using PMFs of autocorrelation and cross-correlations are maximally exploited for accurate MLE computation wherein only a small percentage of low correlated PMFs are used to build an overall MLE model (e.g., that combines multiple PMFs, e.g., models). As an example, the model is a product of probabilities that a particular value is observed at a particular signal stream if other correlated signal streams observe a set of the values. As an example, the routine may employ integer linear programming ("ILP") to find optimal ordering. As an alternate example, the routine may employ maximally constrained minimally constraining heuristics in which it schedules compression streams for compression that have their relevant streams (e.g., for joint use) already scheduled for compression.

In some embodiments, the routine staggers ordering of compression of the correlated variables of periodic streams with different periods wherein a "superperiod" is indicated by a least common multiple of individual periods used for variable ordering.

At block 118, the routine compresses a delta (e.g., a difference) between a predicted value and an actual value of the signal. As an example, the delta can be the MLE-predicted value less the actual value.

At block 120, the routine returns.

In various embodiments, the technology can be applied for either lossy or lossless compression. Both lossy and lossless MLE-based compressions can exploit compression of differential signals between predictions and actual signals. Moreover, lossy compression can employ MLE-based prediction for all or a subset of signals.

Those skilled in the art will appreciate that the steps shown in FIG. 1 and in each of the flow diagrams discussed herein may be altered in a variety of ways. For example, the order of the logic may be rearranged; substeps may be performed in parallel; shown logic may be omitted, or other logic may be included; etc. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 2A:
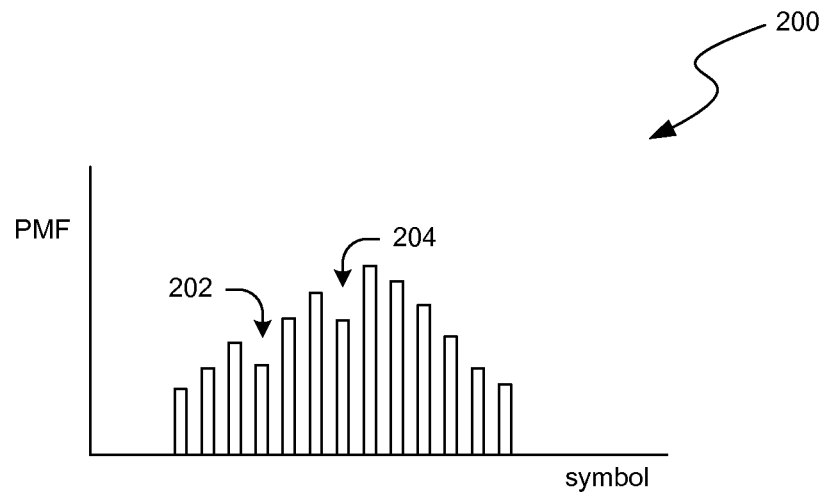
FIGS. 2A-2D show charts illustrating examples of symbol occurrence probabilities in various embodiments.
Figure 2B:
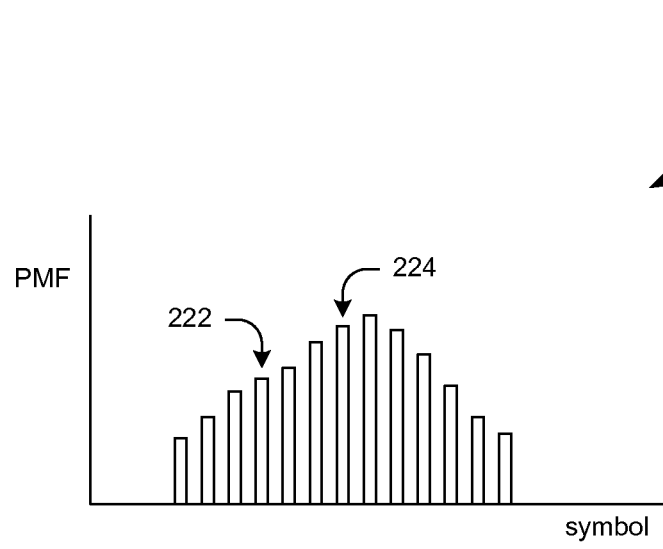

FIGS. 2A-2D show charts illustrating examples of symbol occurrence probabilities in various embodiments. FIG. 2A illustrates a chart 200 of a probability mass function ("PMF") of various symbols used during compression. Although chart 200 is generally smooth, PMFs 202 and 204 do not fit the overall pattern. After the PMFs are smoothed using smoothing techniques known in the art, chart 220 illustrated in FIG. 2B results. PMFs 222 and 224 corresponding to PMFs 202 and 204, respectively, have been modified so that overall chart 220 is smoothed further. The technology may apply smoothing, e.g., to reduce errors.

Figure 2C:
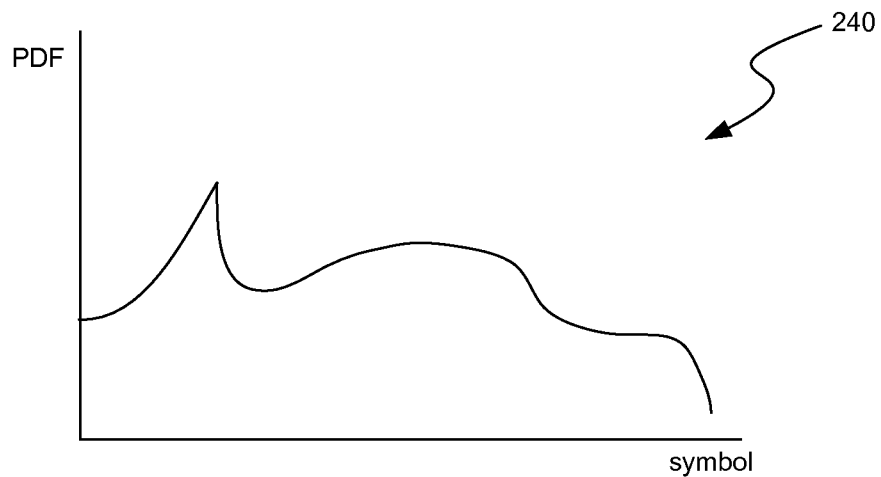
Figure 2D:
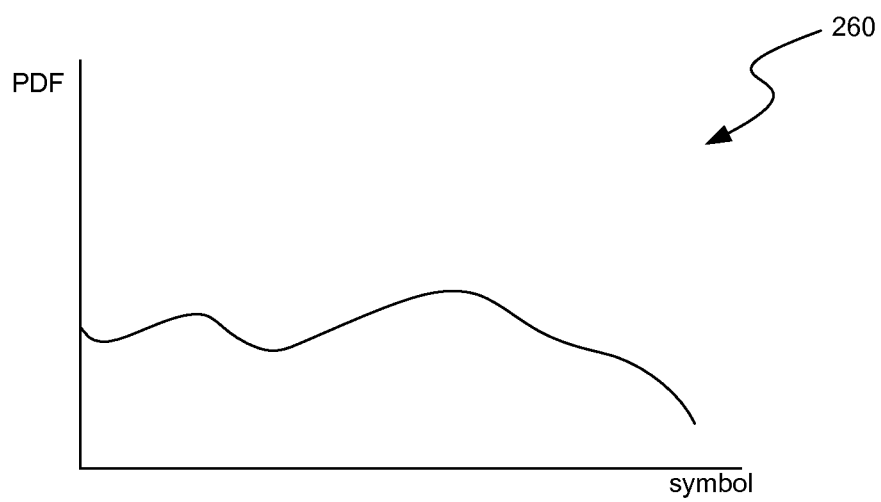

FIG. 2C illustrates a chart 240 of a probability distribution function ("PDF") before smoothing and FIG. 2D illustrates a corresponding chart 260 after smoothing is applied.

Figure 3:
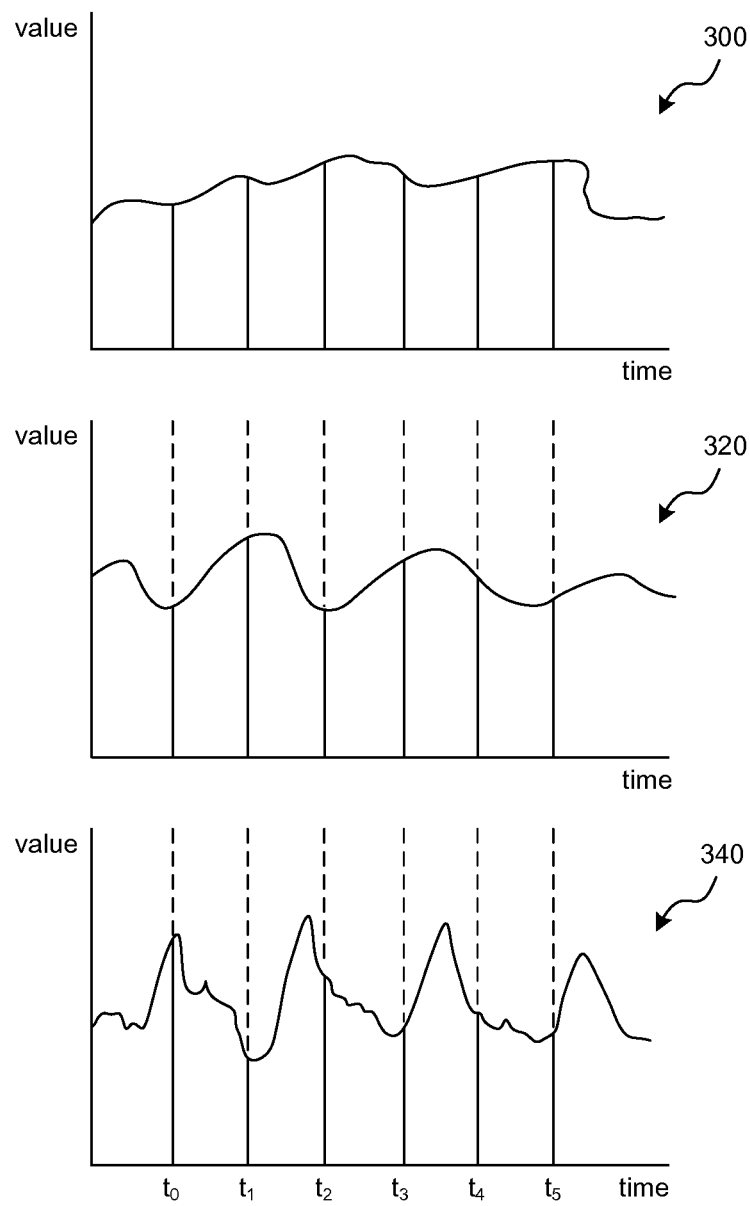
FIG. 3 shows charts illustrating sampling of data from sensors of the data compression technology in various embodiments.

FIG. 3 shows charts illustrating sampling of data from sensors of the data compression technology in various embodiments. Each chart 300, 320, and 340 represents data collected from a different sensor. The signals can be all sampled synchronously at the same time (e.g., $t_0, t_1, t_2$, etc.) or at different times. As an example, the signals can be sampled at staggered times (e.g., one sensor at $t_0$, another sensor at $t_1$, etc.). In various embodiments, the technology may employ synchronous or staggered sampling, e.g., depending on which results in superior compression rates.

Figure 4:
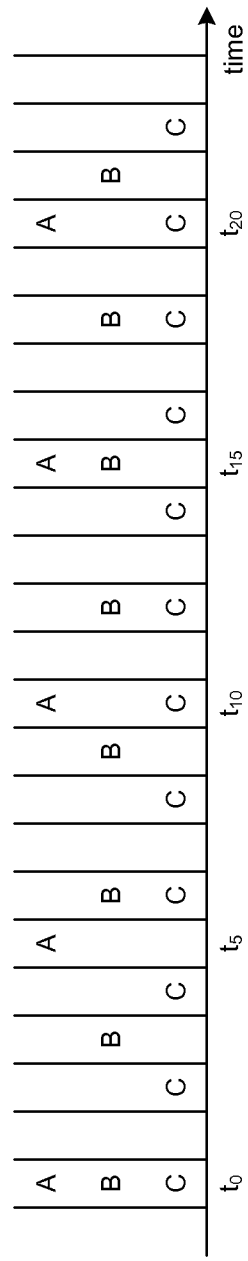
FIG. 4 shows a chart illustrating sampling of data from sensors of the data compression technology in various embodiments.

FIG. 4 shows a chart illustrating sampling of data from sensors of the data compression technology in various embodiments. As depicted, signal A has a periodicity of five because it is sampled every fifth "epoch"; signal B has a periodicity of three because it is sampled every third epoch; and signal C has a periodicity of two because it is sampled every second epoch. If the technology can solve (e.g., determine predictors) for signal ordering for a period of 30 (5×3×2), it can reiterate for an arbitrarily long time interval and compression rates would therefore be very high.

Figure 5:
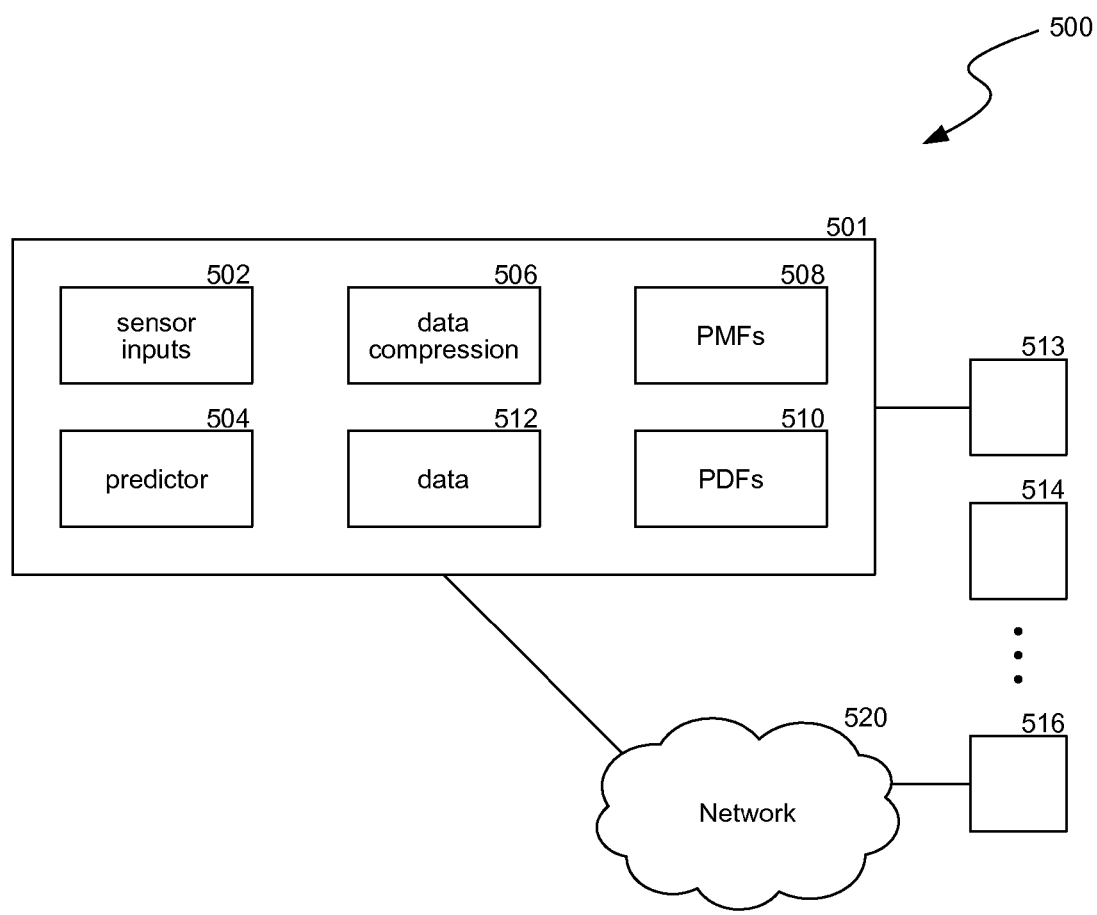
FIG. 5 is a block diagram illustrating an environment in which the data compression technology, and components thereof, may operate in some embodiments.

FIG. 5 is a block diagram illustrating an environment 500 in which the data compression technology, and components thereof, may operate in some embodiments. Environment 500 can include one or more computing devices 501 containing multiple hardware and/or software components. Computing device 501 can contain sensor inputs 502 to receive and digitize signals from sensors 513, 514, 516, etc. into data 512. The technology may create one or more predictors 504 (e.g., MLE-based predictors) that can be used by a data compressor (e.g., that implements data compression methods) 506. The technology may create and update one or more PMFs 508 and PDFs 510 as described above. Sensors 513, 514, and 516 may be accessible to computing device 501 via a network 520 or directly, and may communicate wirelessly or via wire.

Figure 6:
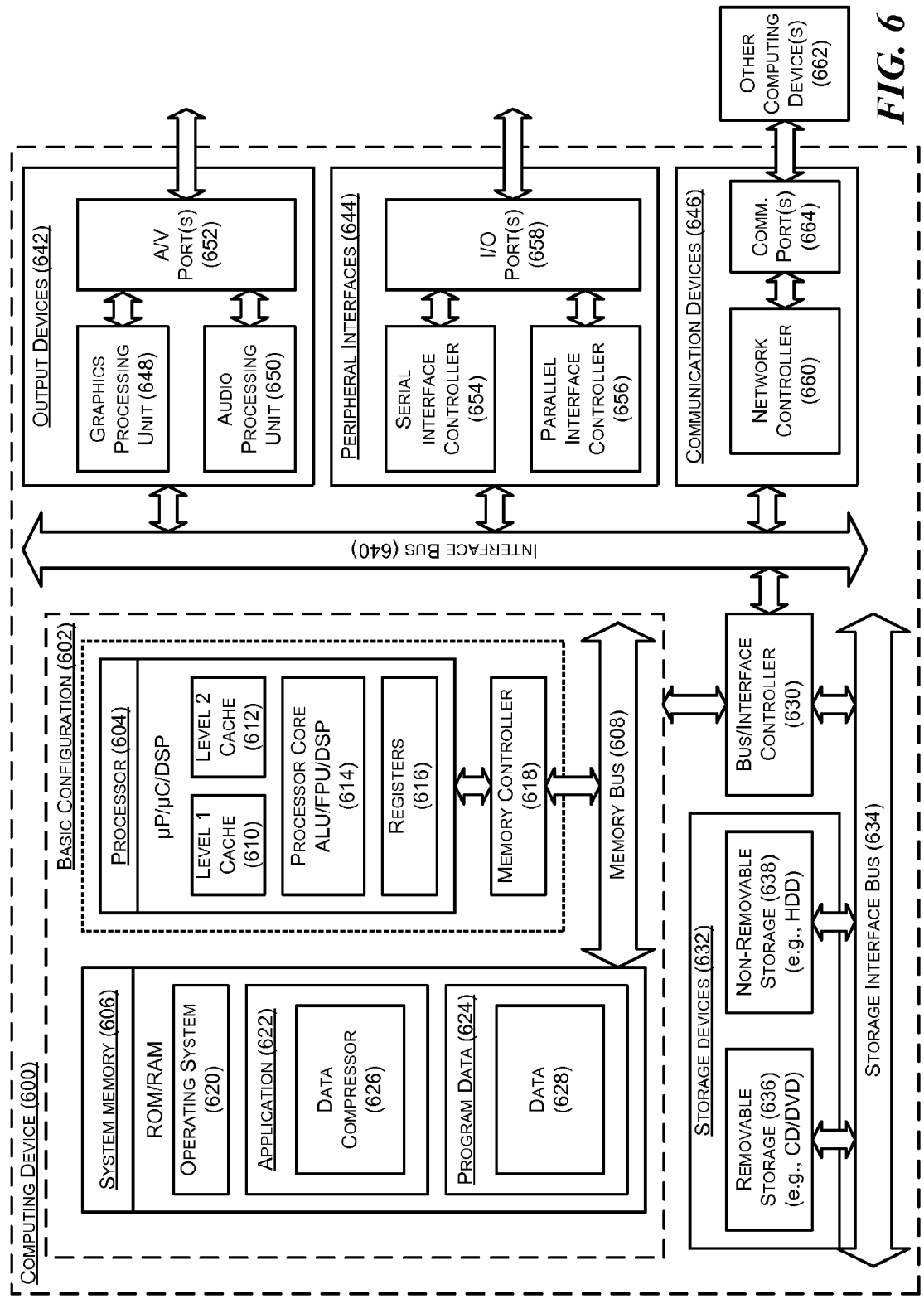
FIG. 6 is a block diagram illustrating an example of a computing device that can be arranged as a suitable computing system for use with the data compression technology in accordance with the present disclosure.

FIG. 6 is a block diagram illustrating an example of a computing device that can be arranged as a suitable computing system for use with the feedback technology in accordance with the present disclosure. In a very basic configuration 602, computing device 600 typically includes one or more processors 604 and a system memory 606. A memory bus 608 may be used for communicating between processor 604 and system memory 606.

Depending on the desired configuration, processor 604 may be of any type including but not limited to a microprocessor ("μP"), a microcontroller ("μC"), a digital signal processor ("DSP"), or any combination thereof. Processor 604 may include one or more levels of caching, such as a level one cache 610 and a level two cache 612, a processor core 614, and registers 616. An example processor core 614 may include an arithmetic logic unit ("ALU"), a floating point unit ("FPU"), a digital signal processing core ("DSP Core"), or any combination thereof. An example memory controller 618 may also be used with processor 604, or in some implementations memory controller 618 may be an internal part of processor 604.

Depending on the desired configuration, system memory 606 may be of any type including but not limited to volatile memory (such as RAM), non-volatile memory (such as ROM, flash memory, etc.) or any combination thereof. System memory 606 may include an operating system 620, one or more applications 622, and program data 624. Application 622 may include one or more components (e.g., a data compressor 626) that are arranged to analyze data, determine urgency, etc. The software components may employ hardware devices, such as sensors. Program data 624 may include data 628 that is compressed. In some embodiments, application 622 may be arranged to operate with program data 624 on operating system 620. This described basic configuration 602 is illustrated in FIG. 6 by those components within the inner dashed line.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include magnetic disk devices such as flexible disk drives and hard-disk drives ("HDDs"), optical disk drives such as compact disk ("CD") drives or digital versatile disk ("DVD") drives, solid state drives ("SSDs"), and tape drives to name a few. Example computer storage media may include volatile and nonvolatile, removable and non-removable media implemented in any method or technology for storage of information, such as computer readable instructions, data structures, program modules, or other data.

System memory 606, removable storage devices 636 and non-removable storage devices 638 are examples of computer storage media. Computer storage media includes, but is not limited to, RAM, ROM, EEPROM, flash memory or other memory technology, CD-ROM, digital versatile disks ("DVDs") or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 640 for facilitating communication from various interface devices (e.g., output devices 642, peripheral interfaces 644, and communication devices 646) to basic configuration 602 via bus/interface controller 630. Example output devices 642 include a graphics processing unit 648 and an audio processing unit 650, which may be configured to communicate to various external devices such as a display or speakers via one or more A/V ports 652. Example peripheral interfaces 644 include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 646 includes a network controller 660, which may be arranged to facilitate communications with one or more other computing devices 662 over a network communication link via one or more communication ports 664.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency ("RF"), microwave, infrared ("IR") and other wireless media. The term computer readable media as used herein may include both storage media and communication media.

Computing device 600 may be implemented as a portion of a small-form factor portable (or mobile) electronic device such as a cell phone, a personal data assistant ("PDA"), a personal media player device, a wireless web-watch device, a personal headset device, an application specific device, or a hybrid device that include any of the above functions. Computing device 600 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or other specific examples or embodiments disclosed herein. It is also to be understood that the terminology used herein is for the purpose of describing particular embodiments only, and is not intended to be limiting.

In an illustrative embodiment, any of the operations, processes, etc. described herein can be implemented as computer-readable instructions stored on a computer-readable medium. The computer-readable instructions can be executed by a processor of a mobile unit, a network element, and/or any other computing device.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits ("ASICs"), Field Programmable Gate Arrays ("FPGAs"), digital signal processors ("DSPs"), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/ or quantities). A typical data processing system may be implemented utilizing any suitable commercially available components, such as those typically found in data computing/ communication and/or network computing/communication systems.

Figure 7:
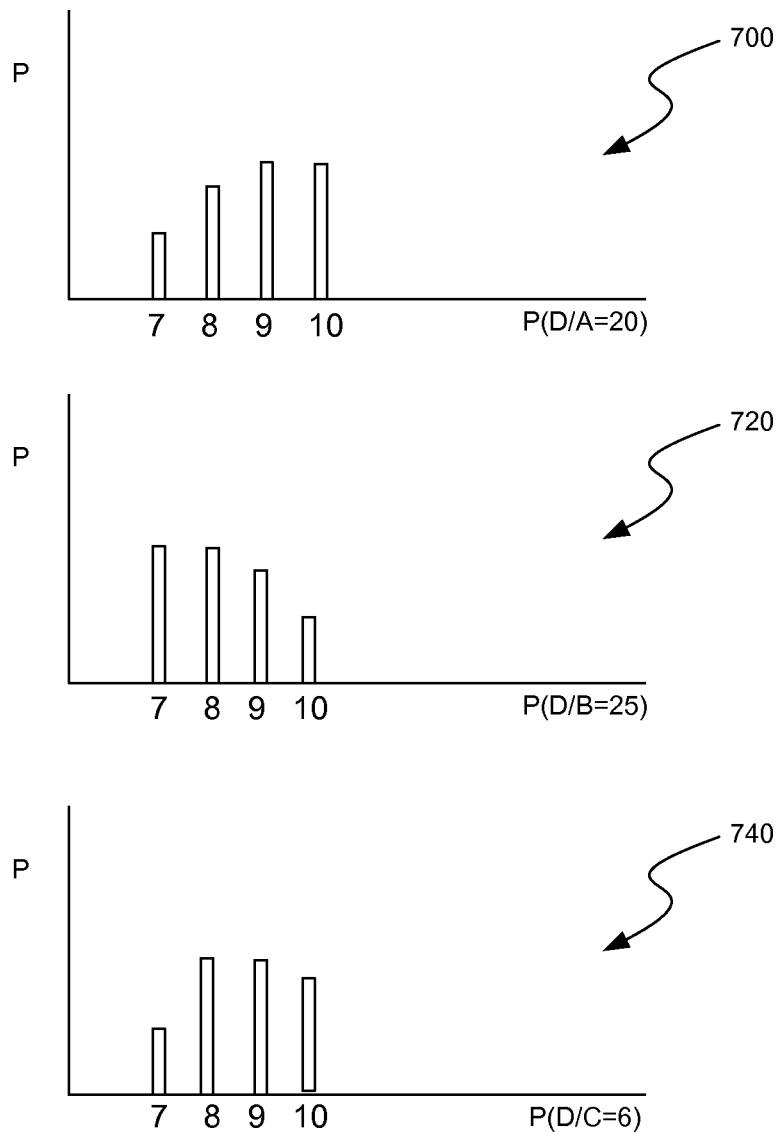
FIG. 7 shows charts illustrating probability mass functions and maximum likelihood estimation.

FIG. 7 shows charts illustrating probability mass functions and maximum likelihood estimation. Chart 700 illustrates bars for probabilities (e.g., P(A=7), P(A=8), P(A=9), P(A=10)). It indicates that P(D/A=20). Charts 720 and 740 similarly illustrates bars for probabilities, but for P(D/B) and P(D/C). These are calculated as follows:

$$P(D,7) = P(A,7) \times P(B,7) \times P(C,7)$$

$$P(D,8) = P(A,8) \times P(B,8) \times P(C,8)$$

$$P(D,9) = P(A,9) \times P(B,9) \times P(C,9)$$

$$P(D,10) = P(A,10) \times P(B,10) \times P(C,10)$$

Then, compression method 8 is selected if P(D,8) is selected if P(D,8) is larger than P(D,7), P(D,9), and P(D,10).

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A method, performed by a computing device having a processor and memory, for compressing data, the method comprising:
    receiving data comprising indications of a signal;
    creating a first subset of the data and a second subset of the data different from the first subset of the data, wherein the first subset of the data overlaps with the second subset of the data;
    deriving, using at least a first prediction model and a second prediction model, a combined prediction model by operating the first prediction model on the first subset of the data, and contemporaneously operating the second prediction model on the second subset of the data;
    predicting a future value for the signal using the combined prediction model;
    applying a function configured to determine a distinction between the predicted future value for the signal and an actual value for the signal; and
    compressing the data based at least in part on the determined distinction.

2. The method of claim 1, further comprising:
pre-processing the received data to increase its suitability for compression or sample prediction, the pre-processing using resampling, requantization, time shifting, transformations, smoothing or other signal processing or statistical techniques.

3. The method of claim 2, further comprising:
measuring an effectiveness of pre-processing using an entropy of a probability mass function corresponding to the pre-processed data.

4. The method of claim 1, wherein the deriving includes executing parametric statistical processing of a probability mass function.

5. The method of claim 1, wherein the deriving includes executing non-parametric statistical processing of a probability mass function.

6. The method of claim 1, wherein the function is applied using a maximum likelihood expectation procedure.

7. The method of claim 1, wherein the future value is a first future value and at least one of the deriving or the predicting is performed a second time to produce a second future value different from the first future value.

8. The method of claim 1, wherein the first subset contains at least half of the data in the second subset.

9. The method of claim 1, wherein the first subset contains at least some data that is different from the data in the second subset.

10. The method of claim 1, wherein the combined prediction model is derived using a set of models comprising at least the first prediction model and the second prediction model, and wherein deriving the combined prediction model comprises:
applying a first ordering of the set of models to the signal to obtain a first predicted future value;
applying a second ordering of the set of models to the signal to obtain a second predicted future value;
determining a first effectiveness of the first ordering based at least in part on the first predicted future value;
determining a second effectiveness of the second ordering based at least in part on the second predicted future value;
determining whether the first effectiveness is greater than the second effectiveness;
in response to determining that the first effectiveness is greater than the second effectiveness, selecting the first ordering as the order in which the set of models will be applied; and
in response to determining that the first effectiveness is not greater than the second effectiveness, selecting the second ordering as the order in which the set of models will be applied.

11. The method of claim 1, wherein the signal represents a sequence of data items and wherein the first subset of data overlaps the second subset of data by:
the first subset of data containing both a first data item from a first point in the sequence and a third data item from a third point in the sequence; and
the second subset of data containing a second data item from a second point in the sequence;
wherein the first point in the sequence is prior to the second point in the sequence, and the second point in the sequence is prior to the third point in the sequence.

12. The method of claim 1, wherein operating the first prediction model on the first subset of the data and contemporaneously operating the second prediction model on the second subset of the data comprises:
operating the first prediction model on the first subset of the data during a particular time period consisting of time prior to predicting the future value for the signal using the combined prediction model; and
operating the second prediction model on the second subset of the data during the particular time period consisting of time prior to predicting the future value for the signal using the combined prediction model.

13. The method of claim 12, wherein the particular time period is entirely after receiving data comprising indications of a signal.

14. The method of claim 1 wherein the first subset of data overlaps the second subset of data by the first subset of data containing data also in the second subset of the data.

15. A computer-readable medium, excluding a propagating signal, storing instructions that, when executed by a computing device, cause the computing device to perform operations for compressing data, the operations comprising:
obtaining a first subset of the data;
shifting or re-sampling one or more signals that correspond to the data to obtain a second subset of the data different from the first subset of the data, wherein the first subset of the data overlaps with the second subset of the data;
formulating a combined prediction model based at least in part on a first prediction model and a second prediction model different from the first prediction model, the first prediction model operating on at least the first subset of the data and the second prediction model operating on at least the second subset of the data, wherein the first prediction model operates on the first subset of the data contemporaneously with the second prediction model operating on the second subset of the data;
predicting a future value for the received data using the combined prediction model;
applying a function that has as parameters at least the predicted future value for the received data and an actual value for the received data; and
compressing the received data using at least a value calculated by the function.

16. The computer-readable medium of claim 15, the operations further comprising:
using a probability mass function or joint probability mass function to determine a suitability of the one or more signals for compression.

17. The computer-readable medium of claim 16, wherein parametric statistical models are used to analyze the suitability of the shifted or re-sampled one or more signals.

18. The computer-readable medium of claim 17, wherein at least one of the statistical models is one or more of classification and regression trees (CART), multivariate adaptive regression splines (MARS), or neural networks.

19. The computer-readable medium of claim 15, wherein the compressing the received data comprises ordering compression of samples of each of the one or more signals based on a model uncertainty measure for that sample.

20. The computer-readable medium of claim 15, the operations further comprising:
applying a first ordering of the two different models to the one or more shifted or re-sampled signals to obtain a first predicted future value;
applying a second ordering, different from the first ordering, of the two different models to the one or more shifted or re-sampled signals to obtain a second predicted future value;
comparing an effectiveness of the first ordering to an effectiveness of the second ordering at least in part by weighing an accuracy of the first predicted future value against an accuracy of the second predicted future value; and selecting an ordering for applying models to signals based at least in part on results of the comparing.

21. The computer-readable medium of claim 15, the operations further comprising:

determining data values, from two or more of the one or more signals, synchronously.

22. The computer-readable medium of claim 15, wherein the at least one subset that contains data in the at least one other subset contains at least half the data in the at least one other subset.

23. The computer-readable medium of claim 15, wherein the at least one subset that contains data in the at least one other subset contains at least some data not in the at least one other subset.

24. The computer-readable medium of claim 15, wherein at least some of the operations of shifting, formulating, predicting and applying are performed iteratively to compress the received data.

25. The computer-readable medium of claim 15, wherein the data is representable as a sequence of data items and wherein the first subset of data overlaps the second subset of data by:

the first subset of data containing both a first data item from a first point in the sequence and a third data item from a third point in the sequence; and the second subset of data containing a second data item from a second point in the sequence;

wherein the first point in the sequence is prior to the second point in the sequence, and the second point in the sequence is prior to the third point in the sequence.

26. The computer-readable medium of claim 15, wherein the first prediction model and second prediction model operate contemporaneously on the first subset of the data and the second subset of the data by:

operating the first prediction model on the first subset of the data during a particular time period consisting of time prior to predicting a future value for the received data using the combined prediction model, and operating the second prediction model on the second subset of the data during the particular time period consisting of time prior to predicting a future value for the received data using the combined prediction model.

27. The computer-readable medium of claim 26, wherein the particular time period is entirely after obtaining a first subset of the data.

28. The computer-readable medium of claim 15, wherein the first subset of data overlaps the second subset of data by the first subset of data containing data also in the second subset of the data.

29. A system for compressing data, the system comprising:
one or more processors;
memory;
means for receiving data comprising one or more signals;
means for creating a prediction model using at least two different models;
means for selecting a subset of the models for sample prediction;
means for determining an order in which the selected subset of models will be applied to a first subset of the data and a second subset of the data different from the first subset of the data, wherein the first subset of the data overlaps with the second subset of the data, and wherein the order indicates that a first one of the at least two of the selected subsets of models operates on the first subset of the data contemporaneously with a second one of the at least two of the selected subsets of models operating on the second subset of the data;

means for formulating predicted future values at least in part by applying the selected subset of models in the determined order;

means for applying a function that has as parameters at least (1) the predicted future values for the data and (2) measured values corresponding to the predicted future values for the data; and means for compressing the data based at least in part on values calculated by the function.

30. The system of claim 29, wherein the selected subset of models comprises at least a first model and a second model different from the first model, and wherein the first model is applied to the first subset of the data, the second model is applied to the second subset of the data, and the first subset of the data overlaps at least half of the data in the second subset of the data.

31. The system of claim 29, wherein the means for determining the order in which the selected subset of models will be applied comprises:

means for applying a first ordering of the selected subset of models to the one or more signals to obtain a first predicted future value;

means for applying a second ordering of the selected subset of models to the one or more signals to obtain a second predicted future value;

means for determining a first effectiveness of the first ordering based at least in part on the first predicted future value;

means for determining a second effectiveness of the second ordering based at least in part on the second predicted future value;

means for determining whether the first effectiveness is greater than the second effectiveness;

means for, in response to determining that the first effectiveness is greater than the second effectiveness, selecting the first ordering as the order in which the selected subset of models will be applied; and means for, in response to determining that the first effectiveness is not greater than the second effectiveness, selecting the second ordering as the order in which the selected subset of models will be applied.

32. The system of claim 29, wherein the selected subset of models comprises at least a first model and a second model different from the first model, and wherein the first model operates on a portion of the data that includes some data not in the data operated on by the second model.

33. The system of claim 29, wherein the one or more signals represent a sequence of data items, and wherein the first subset of data overlaps the second subset of data by:

the first subset of data containing both a first data item from a first point in the sequence and a third data item from a third point in the sequence; and the second subset of data containing a second data item from a second point in the sequence;

wherein the first point in the sequence is prior to the second point in the sequence, and the second point in the sequence is prior to the third point in the sequence.

34. The system of claim 29, wherein the order indicates that at least two of the selected subsets of models operate contemporaneously on the first subset of the data and on the second subset of the data by:

operating a first prediction model, of the selected subset of models, on the first subset of the data during a particular time period consisting of time prior to formulating predicted future values; and operating a second prediction model different from the first prediction model, of the selected subset of models, on the second subset of the data during the particular time period consisting of time prior to formulating predicted future values.

35. The system of claim 34, wherein the particular time period is entirely after selecting a subset of the models for sample prediction.

36. The system of claim 29, wherein the first subset of the data overlaps the second subset of the data by the first subset of the data containing data also in the second subset of the data.

* * * * *

UNITED STATES PATENT AND TRADEMARK OFFICE
CERTIFICATE OF CORRECTION

| | | |
|---|---|---|
| PATENT NO. | : 8,868,476 B2 | Page 1 of 1 |
| APPLICATION NO. | : 13/923250 | |
| DATED | : October 21, 2014 | |
| INVENTOR(S) | : Potkonjak | |

It is certified that error appears in the above-identified patent and that said Letters Patent is hereby corrected as shown below:

Title Page

On Page 2, in item (56), under "OTHER PUBLICATIONS", in Column 1, Line 1, delete "et al," and insert -- et al., --, therefor.

On Page 2, in item (56), under "OTHER PUBLICATIONS", in Column 2, Line 8, delete "S. Laxminaryan," and insert -- S. Laxminarayan, --, therefor.

In the Specification

In Column 1, Line 9, delete "stage entry" and insert -- stage entry filing under 35 U.S.C. §371 --, therefor.

In Column 5, Line 22, delete "patent's" and insert -- patient's --, therefor.

Signed and Sealed this
Fourteenth Day of April, 2015

Michelle K. Lee
*Director of the United States Patent and Trademark Office*